United States Patent [19]

Nishimura

[11] Patent Number: 5,298,765

[45] Date of Patent: Mar. 29, 1994

[54] DIAMOND SCHOTTKY GATE TYPE FIELD-EFFECT TRANSISTOR

[75] Inventor: Kozo Nishimura, Kobe, Japan

[73] Assignee: Kabushiki Kaisha Kobe Seiko Sho, Kobe, Japan

[21] Appl. No.: 858,493

[22] Filed: Mar. 27, 1992

[30] Foreign Application Priority Data

Mar. 29, 1991 [JP] Japan ................................... 3-66483

[51] Int. Cl.$^5$ ..................... H01L 49/00; H01L 27/02; H02B 1/00
[52] U.S. Cl. ....................................... 257/77; 257/255; 257/280; 257/410; 361/704; 361/707
[58] Field of Search ............... 357/15; 257/77, 255, 257/410, 280; 367/386, 388

[56] References Cited

U.S. PATENT DOCUMENTS 5,144,380 9/1992 Kimoto et al. ...................... 357/22

FOREIGN PATENT DOCUMENTS 0445998 7/1990 European Pat. Off. .
57-24913 8/1983 Japan .
58-88487 12/1984 Japan .
1-68966 3/1989 Japan .

OTHER PUBLICATIONS

Japanese Journal of Applied Physics, vol. 28, No. 12, Dec., 1989, pp. L2153-L2154, H. Shiomi, et al., "Field-Effect Transistors Using Boron-Doped Diamond Epitaxial Films".

Primary Examiner—Andrew J. James
Assistant Examiner—Valencia M. Martin
Attorney, Agent, or Firm—Oblon, Spivak, McClelland, Maier & Neustadt

[57] ABSTRACT

Disclosed herein is a diamond Schottky gate type field effect transistor (FET) comprising: an insulating diamond under layer; a doped semiconducting diamond layer as an active layer, which has electrode areas formed by ion implantation such that the interface level is formed near the surface thereof; an insulating diamond layer formed on a portion of the semiconducting diamond layer; a source electrode made of a degenerate diamond film provided in one of the electrode areas of the semiconducting diamond layer, to form an ohmic contact between the same and the semiconducting diamond layer; a drain electrode made of a degenerate diamond film provided in the other of the electrode areas of the semiconducting diamond layer, to form an ohmic contact between the same and the semiconducting diamond layer; and a gate electrode made of a degenerate diamond film formed on the insulating diamond layer, to form a Schottky junction between the same and the semiconducting diamond layer through the diamond insulating layer.

7 Claims, 3 Drawing Sheets

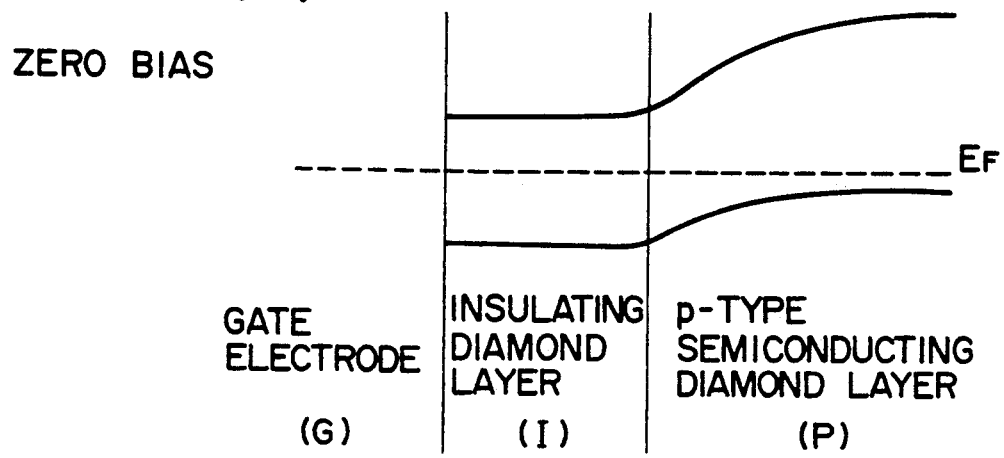
FIG. 3(a) ZERO BIAS
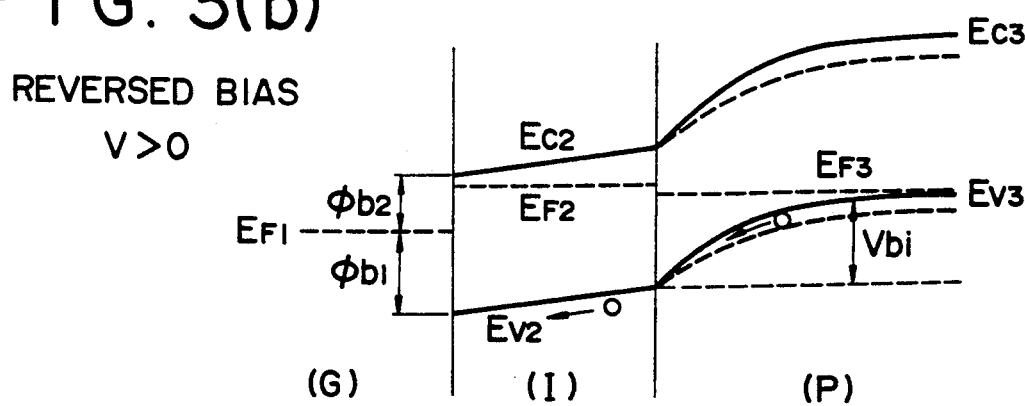
FIG. 3(b) REVERSED BIAS V>0
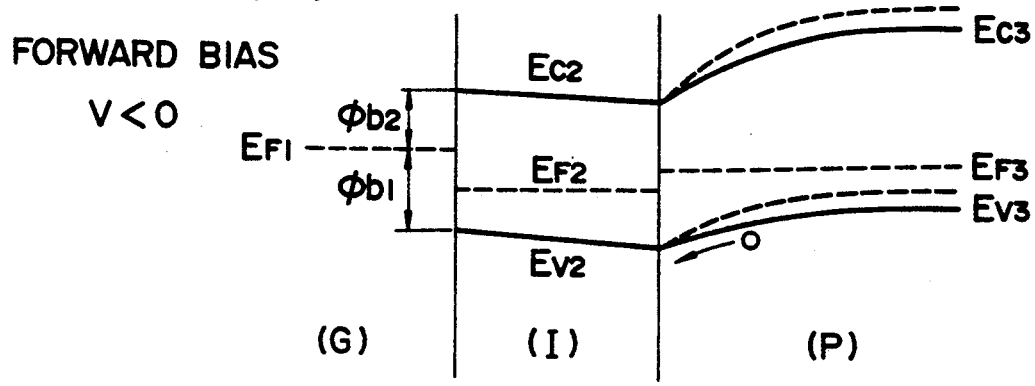
FIG. 3(c) FORWARD BIAS V<0

DIAMOND SCHOTTKY GATE TYPE FIELD-EFFECT TRANSISTOR

BACKGROUND OF THE INVENTION

1. Field of the Invention

The present invention relates to a Schottky gate type field-effect transistor (FET) with the Schottky junction as the gate structure, and particularly, to a diamond Schottky gate type FET having a structure comprising diamond films formed by chemical vapor deposition (CVD).

2. Description of the Prior Art

Diamond has a high thermal conductivity, an excellent stability against heat, and a large band gap. It is electrically insulating but becomes semiconducting upon doping. Therefore, diamond is expected to be used for semiconducting devices which can be operated in a high electric power/high temperature regime. By the advent of the synthesis of diamond films by chemical vapor deposition (CVD), it has now become possible to grow B (boron)-doped p-type semiconducting diamond films and Si (Silicon)-doped n-type semiconducting diamond films.

Research and development effects have been made to develop semiconducting devices employing such semiconducting diamond films. The present applicant has proposed an MIS type diamond FET having a metal electrode/insulating diamond layer/semiconducting diamond layer structure (Japanese Patent Laid-open No. hei 2-63827). FIG. 5 is a schematic cross-sectional view of the conventional MIS type diamond FET (hereafter referred as "MISFET").

In FIG. 5, an insulating diamond under layer 52 is formed on a silicon substrate 51. Three layers are formed on the insulating diamond under layer 52 in the order of; a B-doped p-type semiconducting diamond layer 53 as an active layer, a Si-doped n-type semiconducting diamond layer 54a as an active layer to be a source area, and a Si-doped n-type semiconducting diamond layer 54b as an active layer to be a drain area. Furthermore, an insulating diamond layer 55 is formed on the p-type semiconducting diamond layer 53.

A source electrode 56 having a two-layer structure of Ti (Titanium) and Au (Gold) is provided on the surface of the n-type semiconducting diamond layer 54a, to form an ohmic contact therebetween. Also, a drain electrode 57 made of Au/Ti is provided on the surface of the n-type semiconducting diamond layer 54b, to form an ohmic contact therebetween. Furthermore, a gate electrode 58 made of Au/Ti is provided on the surface of the insulating diamond layer 55.

The MISFET described above can normally operate in high temperatures.

However, the MISFET is disadvantageous in that the thermal expansion coefficient of the metal electrodes are quite different from that of diamond. When it undergoes a heat cycle from about 500° C. to room temperature (about 25° C.), there occur dislocation and defects due to the thermal strain in the semiconducting diamond layers and the insulating diamond layers. Consequently, it cannot normally operate and further introduces a fear of the electrodes peeling off.

SUMMARY OF THE INVENTION

It is therefore an object of the present invention to provide a diamond Shottkey gate type FET having source, drain and gate electrodes, each comprising a diamond film in place of the conventional metal material, thereby allowing it to operate normally under heat cycles over a broad temperature range without the fear of the electrodes peeling off.

To achieve the foregoing object, the present invention provides a diamond Schottky gate type FET comprising: an insulating diamond under layer; a doped semiconducting diamond layer as an active layer, which has electrode areas formed by ion implantation such that the interface level is formed near the surface thereof; an insulating diamond layer formed on a portion of the semiconducting diamond layer; a source electrode made of a degenerate diamond film provided in one electrode area of the semiconducting diamond layer, to form an ohmic contact between the same and the semiconducting diamond layer; a drain electrode made of a degenerate diamond film provided in the other electrode area of the semiconducting diamond layer, to form an ohmic contact between the same and the semiconducting diamond layer; and a gate electrode made of a degenerate diamond film formed on the insulating diamond layer, to form a Schottky junction between the same and the semiconducting diamond layer through the diamond insulating layer.

BRIEF DESCRIPTION OF THE DRAWINGS

The above and other objects, features and advantages of the present invention will be more apparent from the following description taken in connection with the accompanying drawings, in which:

FIG. 3 is an energy band for the gate electrode/insulating diamond layer/p-type semiconducting diamond layer structure in the diamond Schottky gate type FET according to the present invention;

DESCRIPTION OF THE PREFERRED EMBODIMENTS

Figure 1:
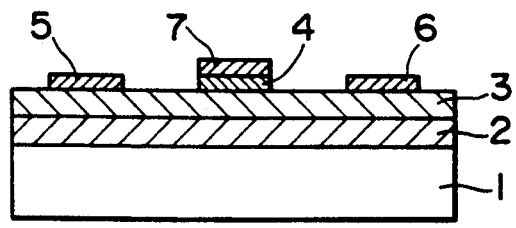
FIG. 1 is a schematic cross-sectional view showing a diamond Schottky gate type FET according to an embodiment of the present invention.

Prior to the description of the preferred embodiments, the function of the diamond Shottkey gate type FET of the present invention will be explained.

In the diamond Schottky gate type FET of the present invention, each of source, drain and gate electrodes is made of a degenerate diamond film and hence has an electrical property similar to that of metal.

It is known that the degenerate diamond film can be formed by chemical deposition (CVD) using a source gas of $CH_4$—$H_2$ mixture added with diborane ($B_2H_6$) for doping boron (B) as a p-type impurity. If the doping is controlled so that a carrier density of about $10^{20}/cm^3$ is established, the resulting B-doped p-type semiconducting diamond is degenerated to become p+ semiconducting diamond which exhibits the electrical properties similar to that of metal.

The source electrode made of the degenerate diamond film is formed in the electrode area of the semiconducting diamond layer as an active layer which is ion-implanted to form an interface level near the surface thereof. Consequently, through the above interface level, carriers can be transported from the source electrode to the semiconducting diamond layer, or from the semiconducting diamond layer to the source electrode, thus forming an ohmic contact therebetween. Likely, the drain electrode also forms an ohmic contact between the same and the semiconducting diamond layer.

The elements to be ion implanted in the electrode area of the semiconducting diamond layer includes: B (boron) being also dopant for the semiconducting diamond; Ar (argon) or C (carbon) being readily available and inexpensive, and also being easily ionized; Ti (titanium), W (tungsten), Ta (tantalum) and Mo (molybdenum) being liable to form carbide; and Fe (iron), Ni (nickel), or Co (cobalt) which readily form a solid solution with carbon in the diamond film and have a large diffusion coefficient in of carbon as compared with Ti and W.

The gate electrode made of the degenerate diamond film is formed on the insulating diamond layer provided on the semiconducting diamond layer. Therefore, it forms a Schottky junction between the same and the semiconducting diamond layer through the insulating diamond layer. This is explained below with reference to the diamond Shottkey FET having the p-type semiconducting diamond layer.

FIG. 3 is an energy band for the gate electrode/insulating diamond layer/p-type semiconducting diamond layer structure of the diamond Schottky FET according to the present invention. In this figure, (a) shows an energy band structure under zero bias (bias voltage V=0), (b) is under a reversed bias (V>0) where a positive voltage is applied to the gate electrode G, and (c) is under a forward bias (V<0) where a negative voltage is applied to the gate electrode G. Furthermore, $E_{F1}$, $E_{F2}$, and $E_{F3}$ show Fermi levels in the gate electrode G, the insulating diamond layer I, and a p-type semiconducting diamond layer P, respectively; $E_{c2}$ and $E_{c3}$ are the energies at the lowest edges of the conduction bands, and also $E_{v2}$ and $E_{v3}$ are the energies at the highest edges of the valence bands, respectively, in the insulating diamond layer I and the p-type semiconducting diamond layer P; $\phi_{b1}$ and $\phi_{b2}$ are the potential barriers at the interface between the gate electrode G and the insulating diamond layer I, respectively; and $V_{bi}$ is the built-in potential of the p-type semiconducting diamond P.

Under a reversed bias where the gate electrode G is positive as shown in FIG. 3(b), the Fermi levels are in order of $E_{F1} < E_{F3} E_{F2}$, and the p-type semiconducting diamond layer P has an energy band greatly bent due to the electric field applied thereon. Therefore, the interface between the p-type semiconducting diamond layer P and the insulating diamond layer I has a high potential barrier which prevents holes from transporting from the p-type semiconducting diamond layer P to the gate electrode G. In addition, the insulating diamond layer I has a uniform electric field, thereby decelerating the holes which have entered it.

Under a forward bias where the gate electrode G is negative as shown in FIG. 3(c), the apparent built-in potential of the p-type semiconducting diamond layer P is decreased and the holes which have entered the insulating diamond layer I are accelerated by the electric field. Consequently, holes are liable to be transported toward the gate electrode G. Meanwhile, electrons are less liable to be transported because of the potential barrier $\phi_{b2}$ at the interface between the gate electrode G and the insulating diamond layer I.

As described above, the source electrode or drain electrode made of the degenerate diamond film forms an ohmic contact between the same and the semiconducting diamond layer as the active layer. The gate electrode made of the degenerate diamond film forms a Schottky junction between the same and the semiconducting diamond layer through the insulating diamond layer. Therefore, there can be obtained the Schottky gate type FET having a structure of an under layer for insulating the elements, a semiconducting layer as an active layer, an insulating layer for forming the Schottky junction excellent in rectifying performance, a gate electrode, a source electrode, and a drain electrode, all of which are made of diamond films.

EXAMPLES

The invention will be described in detail with reference to the following examples.

FIG. 1 is a schematic cross-sectional view showing a diamond Schottky gate type FET according to an embodiment of the present invention.

In the figure: numeral 1 is a high-resistance silicon substrate; 2 is an insulating diamond under layer; 3 is a B-doped p-type semiconducting diamond layer; 4 is an insulating diamond layer; 5 is a source electrode of a B-doped degenerate diamond film formed on the p-type semiconducting diamond layer 3; 6 is a drain electrode of a B-doped degenerate diamond film formed on the p-type semiconducting diamond layer 3; and 7 is a gate electrode of a B-doped degenerate diamond film formed on the insulating diamond layer 4.

FIG. 2 is a schematic view showing the process of producing the diamond Schottky gate type FET of the present invention.

A diamond Schottky gate type FET was prepared in the following procedure. Each layer of diamond films was formed by chemical vapor deposition (CVD), with the substrate kept at 800° C.

Figure 2A:
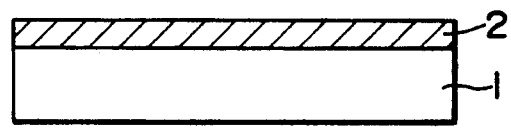
FIG. 2 is a schematic view showing the process of producing the diamond Schottky gate type FET according to the present invention.

(1) A high-resistance silicon substrate 1 (resistivity: more than 1000 Ω·cm, size; 20 mm×10 mm) was prepared by polishing for about 30 minutes by diamond paste having an average particle diameter of 0.25 μm. An undoped polycrystalline insulating diamond under layer 2 of about 3 μm thick was formed on the silicon substrate 1, as shown in FIG. 2(a). As a reaction gas, there was used a source gas of a CH$_4$—H$_2$ mixture (CH$_4$ concentration: 0.5%). The insulating diamond under layer 2 is adapted to electrically insulate the high-resistance silicon substrate 1 from the FET elements to be formed thereon.

Figure 2B:
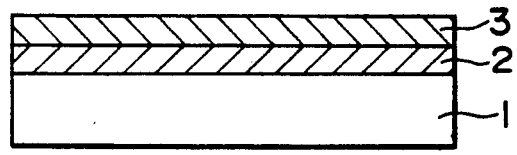

(2) A B-doped p-type polycrystalline semiconducting diamond layer of about 3 μm thick was formed on the insulating diamond under layer 2 by microwave CVD, as shown in FIG. 2(b). As a reaction gas, there was used a source gas of a CH$_4$—H$_2$ mixture (CH$_4$ concentration: 0.5%) added with a doping gas of diborane (B$_2$H$_6$) diluted with H$_2$ in a concentration of 0.1 ppm to the whole gas flow rate of 100 sccm. The reaction time used was 14 hours.

Figure 2C:
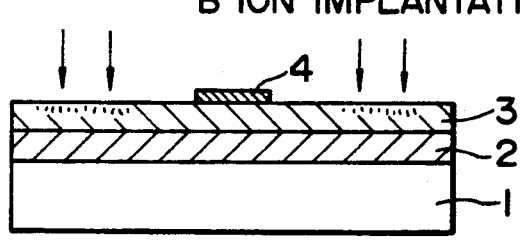

(3) A mask of a-Si (amorphous silicon) of about 300Å was formed on the p-type semiconducting diamond layer 3 by plasma CVD, excluding the area where the insulating diamond layer 4 was formed. An undoped polycrystalline insulating diamond layer 4 of about 0.1 μm thick was then formed by utilizing the property that the diamond film does not grow on the a-Si mask, as shown in FIG. 2(c). The source gas pressure was 31.5 Torr, and the reaction time used was 1 hour. The source gas was a CH$_4$—H$_2$ mixture (CH$_4$ concentration: 0.5%) added with oxygen in a concentration of 0.1% to the whole gas flow rate of 100 sccm.

(4) After removing the a-Si mask using a mixture of HF (hydrofluoric acid) and HNO$_3$ (nitric acid), the p-type semiconducting diamond layer 3 was coated with a photoresist, excluding the areas to form a source electrode 5 and a drain electrode 6. The electrode areas were ion-implanted with B-ion to form the interface level near the surface of the p-type semiconducting diamond layer 3, as shown in FIG. 2(c). The acceleration voltage was 40 keV, and the B ion dosage was $10^{15}$/cm$^2$.

Figure 2D:
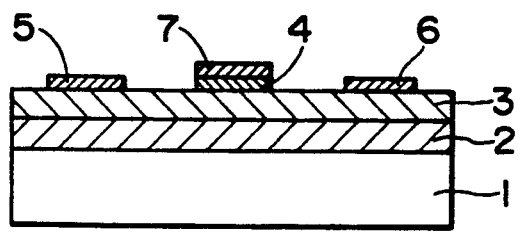

(5) After removing the photoresist, a photoresist was again applied to cover the areas for the source electrode 5, drain electrode 6, and gate electrode 7, and an a-Si mask was then formed. Thus, the surface excluding these electrode areas was covered with the a-Si mask by lift-off. The source electrode 5 and drain electrode 6, each being made of a B-doped degenerate diamond film of about 1 μm thick were formed on respective electrode areas in the p-type semiconducting diamond layer 3. The gate electrode 7 made of the B-doped degenerate diamond film of about 1 μm thick was formed on the insulating diamond layer 4, as shown in FIG. 2(d). The source gas was a CH$_4$H$_2$ mixture (CH$_4$ concentration: 0.5%) added with a doping gas of diborane (B$_2$H$_6$) diluted with H$_2$ in a concentration of 1 ppm to the whole gas flow rate of 100 sccm.

Figure 4:
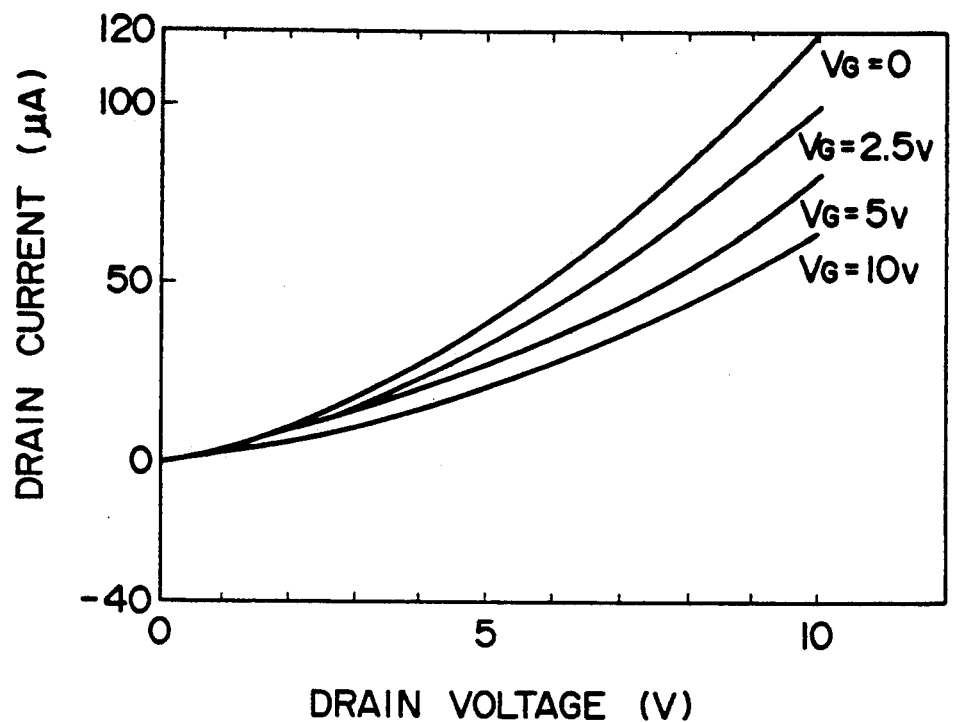
FIG. 4 is a graph showing the drain current-drain voltage characteristics of the diamond Schottky gate type FET according to the present invention.
Figure 5:
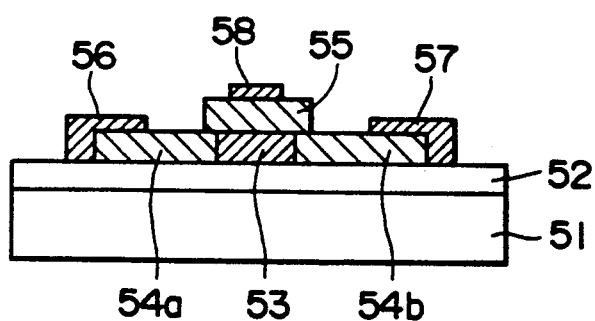
FIG. 5 is a schematic cross-sectional view showing a conventional MISFET.

The diamond Schottky gate type FET thus obtained was tested for the drain current-drain voltage characteristics with respect to the gate voltage VG. The results are shown in FIG. 4. It was found that the sample could be operated normally in heat cycles from room temperature (about 25° C.) to 800° C. without suffering from the peeling of the source, drain, and gate electrodes. Furthermore, the reverse current at the gate electrode was extremely small, with no variation.

As described above, the present invention provides a diamond Schottky gate type FET having a structure of a under layer for insulating the elements, a semiconducting layer as an active layer, an insulating layer for forming a Schottky junction excellent in rectifying performance, a gate electrode, a source electrode, and a drain electrode, all of which are made of diamond films. Therefore, it does not yield heat strain unlike the conventional one composed of dissimilar materials, and can be operated normally even when it undergoes heat cycles over a broad temperature range without suffering from the peeling of the electrodes.

What is claimed is:

1. A diamond Schottky gate type field effect transistor (FET) comprising:
    an insulating diamond under-layer;
    a doped semiconducting diamond active layer above said insulating diamond underlayer, which has electrode areas formed by ion implantation such that an interface level is formed near the surface of said active layer in each of said electrode areas;
    an insulating diamond layer formed on a portion of said semiconducting diamond layer;
    a source electrode comprising a degenerate diamond film disposed on a first one of said electrode areas of said semiconducting diamond layer, wherein an ohmic contact is formed between the source electrode and said semiconducting diamond layer;
    a drain electrode comprising a degenerate diamond film disposed on a second one of said electrode areas of said semiconducting diamond layer, to form an ohmic contact between the drain electrode and said semiconducting diamond layer; and
    a gate electrode comprising a degenerate diamond film formed on said insulating diamond layer, wherein a Schottky junction is formed between the gate electrode and said semiconducting diamond layer.

2. A diamond Schottky gate type transistor, comprising:
    a doped semiconducting diamond active layer having a first doping density, said active layer having first and second electrode areas doped to a higher second doping density;
    a drain electrode comprising a degenerate diamond film provided on said second electrode area of said semiconducting diamond layer, wherein an ohmic contact is formed between the drain electrode and the semiconducting diamond layer.

3. A transistor according to claim 2, further comprising an insulating diamond layer formed on a portion of said semiconducting diamond layer.

4. A transistor according to claim 3, further comprising:
    a gate electrode comprising a degenerate diamond film formed on said insulating diamond layer, wherein a Schottky junction is formed between the gate electrode and the semiconducting diamond layer through said insulating diamond layer.

5. A transistor according to claim 2, wherein:
    said first and second electrode areas are in a first surface of said active layer; and
    further comprising an insulating diamond under-layer attached to that side of said doped semiconducting diamond layer which is opposite said first surface.

6. A diamond Schottky gate type transistor according to claim 2, comprising:
    a source electrode comprising a degenerate diamond film provided on said first electrode area, wherein an ohmic contact is formed between the source electrode and said active layer.

7. A transistor according to claim 2, further comprising:
    a source electrode comprising a degenerate diamond film provided on said first electrode area, wherein an ohmic contact is formed between the source electrode and said active layer.

* * * * *